United States Patent
Liu et al.

(10) Patent No.: US 8,586,465 B2
(45) Date of Patent: Nov. 19, 2013

(54) THROUGH SILICON VIA DIES AND PACKAGES

(75) Inventors: Hao Liu, Singapore (SG); Yi Sheng Anthony Sun, Singapore (SG); Ravi Kanth Kolan, Singapore (SG); Chin Hock Toh, Singapore (SG)

(73) Assignee: United Test and Assembly Center Ltd, Singapore (SG)

( * ) Notice: Subject to any disclaimer, the term of this patent is extended or adjusted under 35 U.S.C. 154(b) by 0 days.

(21) Appl. No.: 12/133,376

(22) Filed: Jun. 5, 2008

(65) Prior Publication Data

US 2008/0303163 A1 Dec. 11, 2008

Related U.S. Application Data

(60) Provisional application No. 60/942,458, filed on Jun. 7, 2007.

(51) Int. Cl.
*H01L 21/768* (2006.01)

(52) U.S. Cl.
USPC ........... 438/598; 257/686; 257/774; 257/777; 257/E21.705; 257/E21.597; 257/E23.011; 257/E25.013; 257/E25.023; 438/106; 438/107; 438/108; 438/109

(58) Field of Classification Search
USPC .......... 257/621, 686, 698, 773–774, E21.511, 257/E21.597, E23.004, E23.067, E23.178, 257/E25.023, 777, E25.013, E23.011, 257/E21.705; 438/106–109, 598

See application file for complete search history.

(56) References Cited

U.S. PATENT DOCUMENTS

| | | | |
|---|---|---|---|
| 5,424,245 A * | 6/1995 | Gurtler et al. | 438/107 |
| 6,514,845 B1 * | 2/2003 | Eng et al. | 438/613 |
| 6,943,106 B1 * | 9/2005 | Kirby et al. | 438/637 |
| 7,317,256 B2 | 1/2008 | Williams et al. | |
| 7,459,774 B2 * | 12/2008 | Kwon et al. | 257/686 |
| 2003/0080408 A1 * | 5/2003 | Farnworth et al. | 257/698 |
| 2004/0048459 A1 * | 3/2004 | Patti | 438/612 |
| 2005/0029650 A1 * | 2/2005 | Wood et al. | 257/698 |
| 2006/0148250 A1 * | 7/2006 | Kirby | 438/667 |
| 2007/0132105 A1 * | 6/2007 | Akram et al. | 257/774 |
| 2008/0079121 A1 | 4/2008 | Han | |
| 2008/0138973 A1 * | 6/2008 | Kirby et al. | 438/613 |

* cited by examiner

*Primary Examiner* — Ermias Woldegeorgis (74) *Attorney, Agent, or Firm* — Horizon IP Pte. Ltd.

(57) ABSTRACT

A method for preparing a die for packaging is disclosed. A die having first and second major surfaces is provided. Vias and a mask layer are formed on the first major surface of the die. The mask includes mask openings that expose the vias. The mask openings are filled with a conductive material. The method includes reflowing to at least partially fill the vias and contact openings to form via contacts in the vias and surface contacts in the mask openings.

15 Claims, 8 Drawing Sheets

THROUGH SILICON VIA DIES AND PACKAGES

BACKGROUND

Miniaturization of consumer electronics with increased functionality and high density memory has long been one of the major drivers in semiconductor packaging developments. Extremely dense electronics can be created by stacking thin silicon chips with interconnections in the vertical direction. Through silicon via (TSV) process is one of the techniques used in the packaging industry which enables stacking of thin silicon integrated circuits (ICs) to provide heterogeneous integration and a potential increase in the physical density of some electronic systems' functions. Additionally, this technology enables potential architectural configurations for true vertical integration among multiple IC layers by dramatically increasing the area interconnect capability of a given IC.

It is desirable to improve on TSV technology, for example, simplifying design and processing to improve yields, decrease costs and/or improving throughput.

SUMMARY

Embodiments relate generally to chip packages. More particularly, embodiments relate to 3D chip packages. The 3D chip packages can be facilitated by TSV dies.

A method for preparing a die for packaging is provided in one aspect. The method includes providing a die having first and second major surfaces. Vias are formed on the first major surface of the die. The method includes forming a mask layer on the first major surface. The mask comprises mask openings that expose the vias. The mask openings are filled with a conductive material. The method further includes reflowing to at least partially fill the vias and contact openings to form via contacts in the vias and surface contacts in the mask openings.

In another embodiment, a method of packaging that includes providing n number of dies having via contacts through the major surfaces of the dies is disclosed. The method includes stacking the n number of dies to form a die stack, where n=1 is the bottom die, n=n is the top die of the stack, wherein vias on the $n^{th}$ die is coupled to the vias of adjacent die or dies. At least one of the dies of the stack comprises a reflowed type die, the reflowed type die comprises a die substrate having first and second major surfaces and vias through the major surfaces. The reflowed typed die includes a mask on the first major surface having contact openings corresponding to the vias, and via contacts in the vias and surface contacts in the contact openings, wherein forming the contacts comprises filling the contact openings with a conductive material and reflowing to fill the via openings.

A die that includes a die substrate having first and second major surfaces is presented in another aspect. The die includes vias passing through first and second surfaces of the die and a contact mask on the first major surface. The contact mask comprises mask openings corresponding to the vias. The die further includes a conductive material filling the vias and mask openings to form via contacts in the vias and surface contacts in the mask openings.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DESCRIPTION

Embodiments generally relate to preparing chips for packaging and chip packages. Other types of applications can also be useful. Various types of chips or ICs can be packaged. For example, the IC can be a memory device such as a dynamic random access memory (DRAM), a static random access memory (SRAM) and various types of non-volatile memories including programmable read-only memories (PROM) and flash memories, an optoelectronic device, a logic device, a communication device, a digital signal processor (DSP), a microcontroller, a system-on-chip, as well as other types of devices. The ICs can be incorporated into various products, such as phones, computers, personal digital assistants or other types of suitable products.

Figure 1:
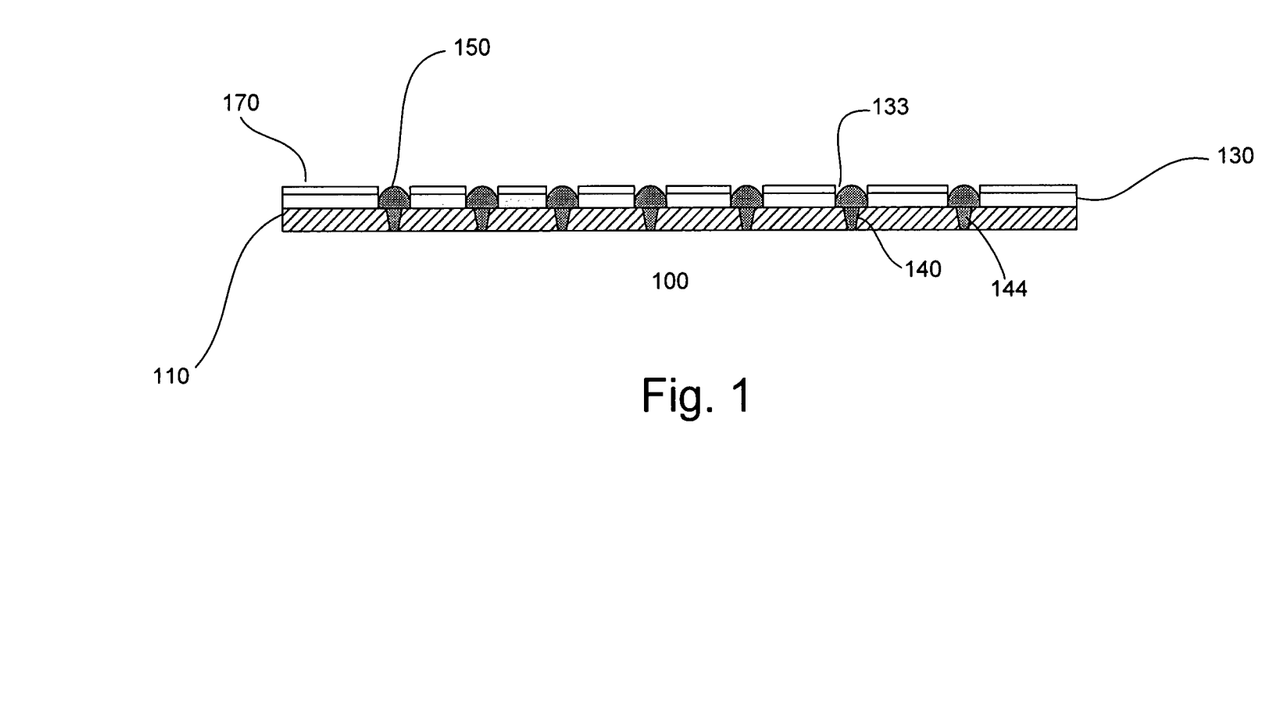
FIG. 1 shows an embodiment of a chip.

FIG. 1 shows an embodiment of a TSV die or chip 100. The die comprises a substrate 110 with first (bottom) and second (top) major surfaces having circuit components formed therein. The substrate comprises a semiconductor substrate, such as silicon. Other types of substrates, for example, silicon-on-insulator, are also useful.

At least one through via 140 is provided. The through via passes through the major surfaces of the substrate 110. In one embodiment, the through via comprises a tapered sidewall profile. For example, the sidewalls are tapered about 70° to 90°. Tapering of the sidewalls facilitates filling of the via. For example, the tapered sidewall encourages uniform material coverage of the sidewalls and base of the via which reduces formation of voids. Providing vias with a non-tapered sidewall profile is also useful.

The via is filled with a conductive material to form via contact 144. The surface of the die comprises at least one surface contact 150. The surface contact is coupled to the via contact. Generally the die comprises a plurality of via and surface contacts. The via and surface contacts can be arranged in a desired pattern. For example, the contacts can be arranged in a grid or array pattern. Other patterns, such as locating the contacts and about the periphery of the die, are also useful. The via and surface contacts preferably comprise the same material. In one embodiment, the via and surface contacts comprise solder. Various types of solders can be used. The solder, for example, comprise lead or lead free solder.

A contact mask is 130 is disposed on the top surface of the die. The contact mask comprises contact openings 133 which expose the surface contacts. In one embodiment, the contact mask comprises a patterned photoresist. Other types of materials can be used to serve as the contact mask. For example, the contact mask may comprise a solder mask. In one embodiment, the contact mask facilitates forming the via and surface contacts. For example, the contact mask provides contact openings which can function as a stencil for disposing conductive material for forming the via and surface contacts. A die attach (DA) layer 170 can be provided on the contact mask. The DA layer, for example, comprises die attach film or B-stage die attach adhesive and is used to securely stack another die thereover. A plurality of dies can be stacked together to form a die stack.

Figure 2:
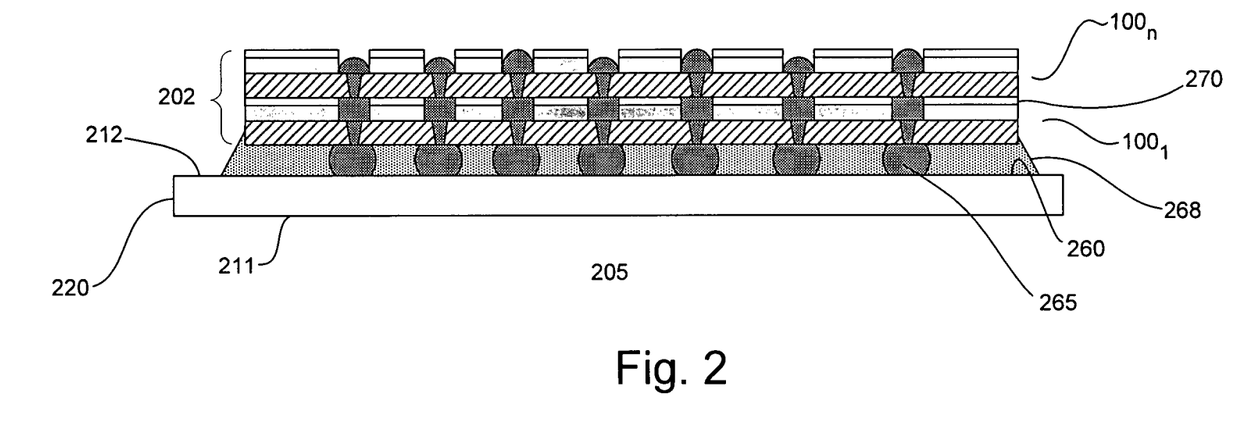
FIG. 2 shows an embodiment of a chip package.

FIG. 2 shows an embodiment of a package 205. The package includes a carrier or package substrate 220 with bottom and top major surfaces 211 and 212. The carrier, for example, can be a single or multi-layered laminate substrate. Other types of carriers are also useful. Package contacts (not shown) are disposed on one of the major surfaces. In one embodiment, the package contacts are located on the bottom surface. The package contacts can comprise spherical shaped structures or balls arranged in a grid pattern to form a BGA. The balls, for example, comprise solder. Various types of solders can be used, such as lead or lead free alloys. Arranging the contacts in other patterns or providing other types of contacts or materials are also useful.

In one embodiment, a die bonding region 260 is provided on the top surface of the carrier. The die bonding region comprises bonding contacts 265. The bonding contacts comprise spherical shaped structures or balls. The bonding contacts can be arranged in various patterns. For example, the contacts can be arranged in a grid pattern. The pattern of the bonding contacts should correspond to the via pattern of the chip to be mounted thereon. Other types of patterns are also useful. The bonding contacts, for example, comprise solder. Various types of solders can be used, such as lead or lead free alloys. The bonding contacts are interconnected to the package contacts on the bottom surface of the carrier.

In one embodiment, a die stack 202 is mounted onto the package. The die stack comprises n number of dies $100_1$-$100_n$, where n is ≥2. A DA layer 270 can be provided to facilitate stacking the dies together. The dies, for example, comprise TSV chips as described in FIG. 1. In one embodiment, via contacts of the bottom chip (n=1) of the stack are coupled to the bonding contacts of the package. For other chips, the via contacts are coupled to the surface contacts of the chip below. The dies of the die stack can be of the same type and/or size. Providing a die stack having chips which are different types and/or sizes is also useful. As for the die at the top of the stack, it can be a TSV or other types of dies. For example, the top die can be a flip chip. A DA film can be provided on a top surface of the dies to facilitate stacking.

In one embodiment, an underfill 268, such as epoxy, can be provided in the cavity formed in between the chip and the carrier to encapsulate and protect the bonding contacts. The underfill, for example, serves to reduce thermal stress between the bumps and contact pads, improving reliability. The underfill preferably fills the space between the chip and the carrier, completely encasing the bumps. Various techniques can be used to provide the underfill in the cavity. The underfill, for example, can be needle-dispensed along the edges of the die and drawn into the space between the die and carrier by capillary action and cured to form a permanent bond. Other techniques for applying the underfill are also useful. A cap (not shown) can be provided to encapsulate the chip stack. The cap, for example, comprises a molding compound.

Figure 3A:
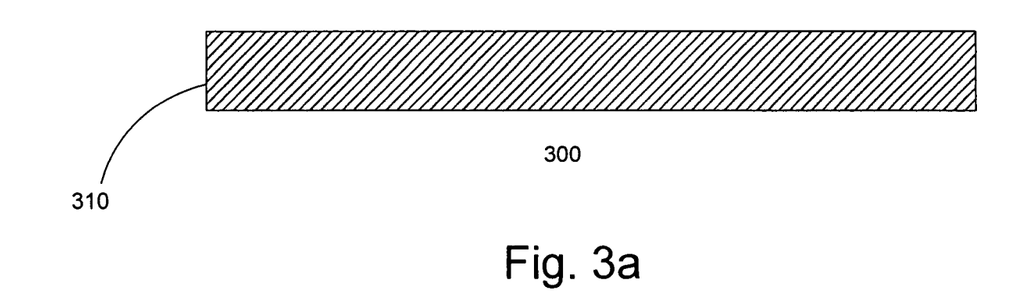
FIGS. 3*a-k* show an embodiment of packaging chips.

FIGS. 3*a*-*k* show an embodiment of a process for preparing a die and assembling dies in a package. FIG. 3*a* shows a die 300. The die comprises a substrate 310 with first (bottom) and second (top) major surfaces. The substrate comprises a semiconductor substrate, such as silicon. Other type of substrates, for example, silicon-on-insulator, are also useful. The substrate is prepared with circuit components, such as transistors, resistors, capacitors and interconnections to form an IC. A passivation layer can be provided to protect the die. Generally, a plurality of dies are processed in parallel on wafer which serves as the substrate for the dies. The thickness of the wafer, for example, can be about 700 μm. Providing wafers with other thicknesses is also useful.

Figure 3B:
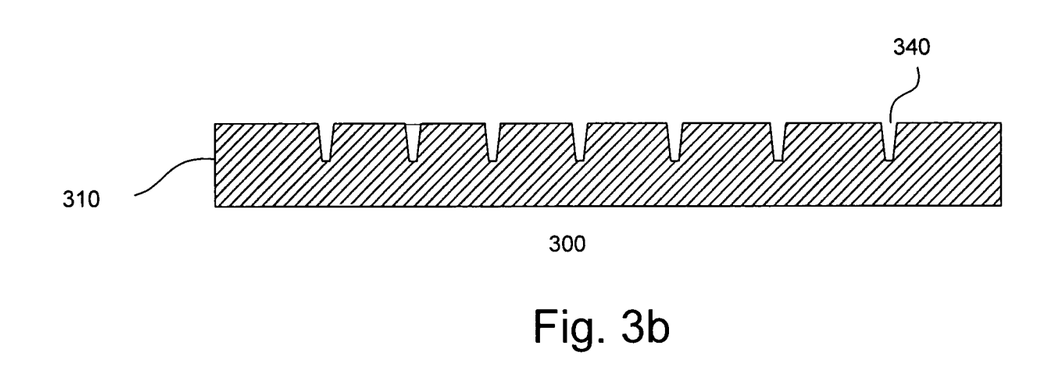

Referring to FIG. 3*b*, blind vias 340 are formed. In one embodiment, the vias are formed by laser drilling. Other techniques, such as deep reactive ion etching (DRIE), are also useful. DRIE, for example, includes forming a mask layer on the die and patterned to expose portions of the die where the vias are to be formed. The mask layer, for example, comprises photoresist. Other types of masks, such as a hard mask, are also useful. The exposed portions of the die are etched by DRIE, forming the blind vias. In one embodiment, the blind vias are formed with a tapered profile. For example, the vias comprise a tapered sidewall profile of about 70° to 90°. Tapering of the sidewalls facilitates filling of the via. For example, the tapered sidewall facilitates uniform material coverage of the sidewalls and base of the via which reduces formation of voids. Providing vias with a non-tapered sidewall profile is also useful. The etch mask can be removed after the vias are formed. UBM plating may be performed on the surface of the die to form a compatible interface with the contacts. Various conventional UBM processes can be used.

Figure 3C:
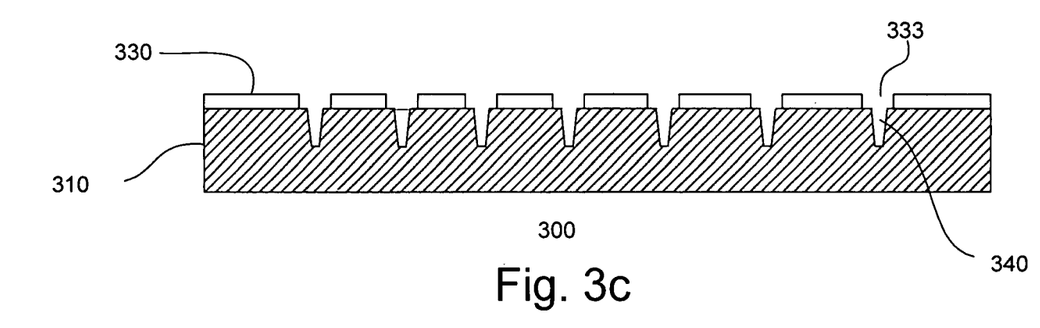

In FIG. 3*c*, a contact mask 330 is formed on the top surface of the die. The contact mask, for example, comprises photoresist. Other types of contact masks are also useful. The photoresist is selectively exposed with an exposure source and developed to form contact openings 333 which expose the vias. Alternatively, a solder mask can be used to serve as the contact mask. The solder mask can be, for example, stencil printed onto the top surface of the die with openings exposing the vias. The mask thickness and size of the openings are selected to accommodate a sufficient amount of conductive material to produce surface and via contacts with the desired dimensions.

Figure 3D:
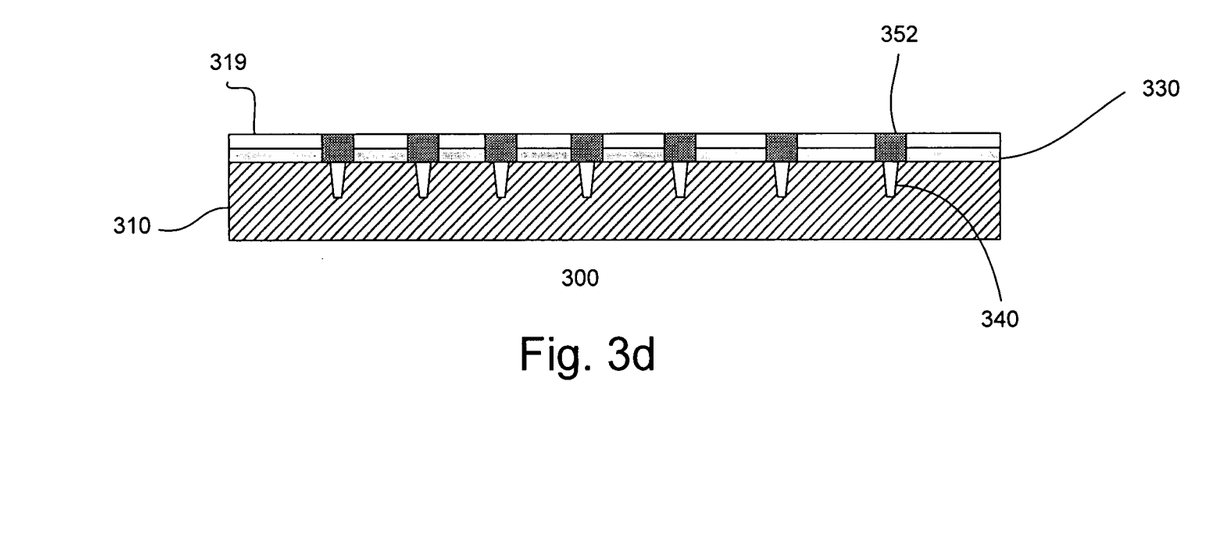

In FIG. 3*d*, a conductive material 352 is deposited on the substrate, filling at least the contact openings. In one embodiment, the conductive material comprises solder paste. Various types of solder paste can be used. For example, lead or lead free solder paste can be used. The solder paste can be formed in the opening using solder paste printing techniques with a stencil 319. The stencil can be a mesh screen or metal stencil. Other techniques for printing solder in the contact openings are also useful.

Figure 3E:
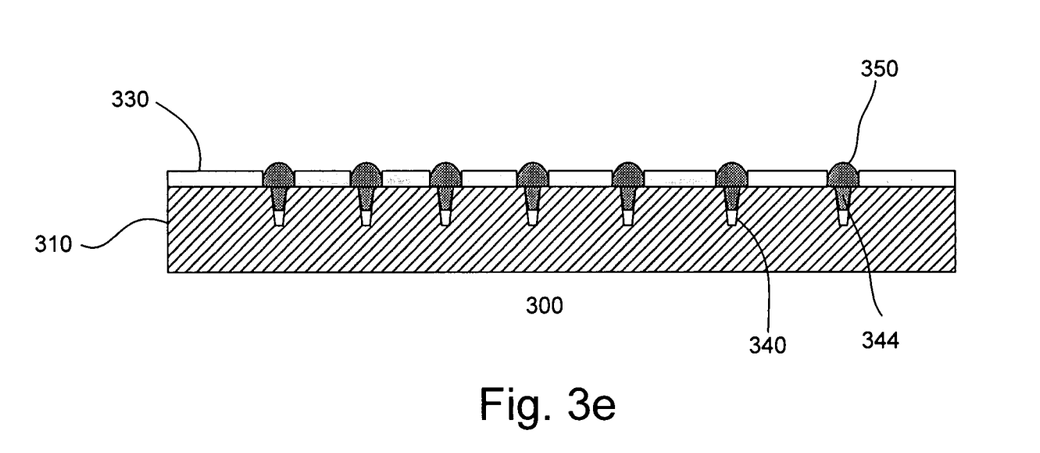

Referring to FIG. 3*e*, the stencil is removed after printing the solder paste. A reflow process is performed. Reflowing at least partially fills the vias due to capillary effect to form via contacts 344. The reflow also forms hemispheric shaped surface contacts 350 in the contact openings over the via contacts. It will be understood that the reflow temperature would be dependent on the type of conductive material used and would typically be conducted at temperatures sufficient to reflow and melt the conductive material.

Figure 3F:
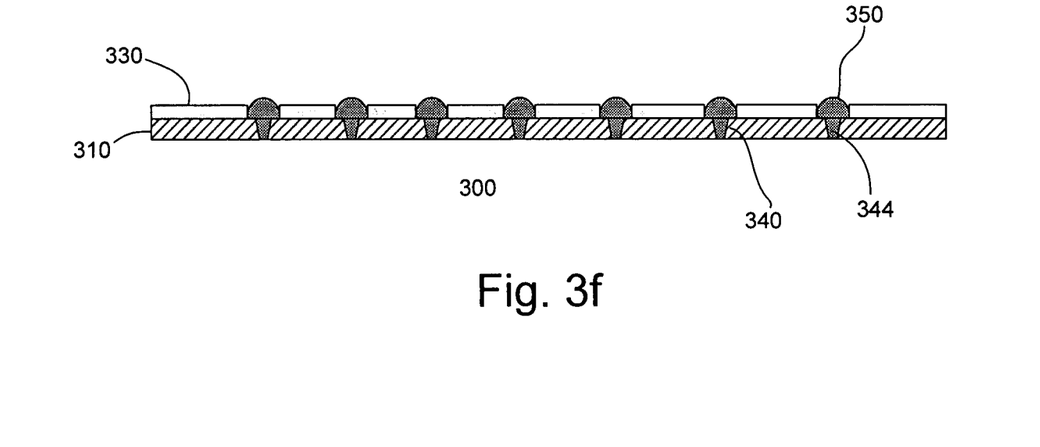
Figure 3G:
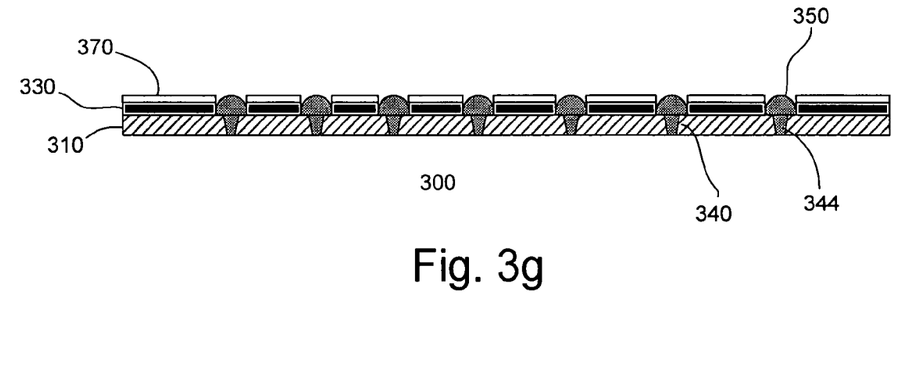

In one embodiment, as shown in FIG. 3*f*, the bottom surface of the wafer is grinded (backgrinding) to reduce the thickness of wafer. The backgrinding exposes the bottom of the via contacts. A DA film 370 can be formed on the top of the die as shown in FIG. 3*g*. For example, the DA film is formed on the contact mask. The DA film serves as an adhesive for attaching another die thereto.

The wafer, in one embodiment, can be diced to separate the wafer into individual dies.

Figure 3H:
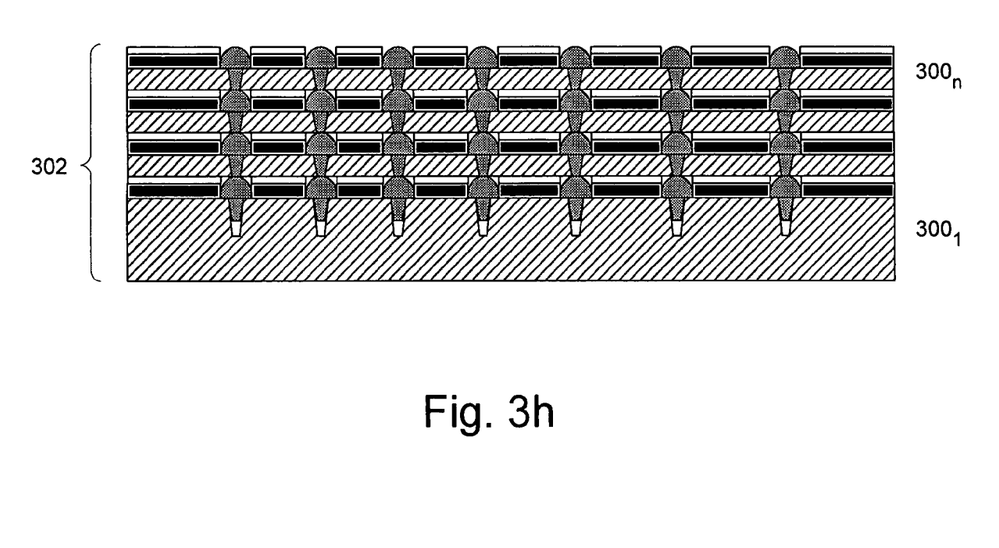

In FIG. 3*h*, a plurality of dies $300_1$-$300_n$ are stacked to form a die stack 302. Illustratively, the die stack comprises four dies (n=4). Providing other number of dies are also useful.

The dies of the die stack can be of the same type and same size. Providing a die stack having dies which are different types of sizes are also useful. As for the die at the top of the stack, it can be a TSV or other types of dies. For example, the top die can be a flip chip. In one embodiment, the dies of the stack comprise the same type.

The die at the bottom of the stack (n=1) is referred to as a mother die. In one embodiment, backgrinding, at this point, has not been performed on the mother die. This enables the mother die to provide mechanical support and avoid the need for a temporary carrier substrate for support during the stacking process. In one embodiment, the mother die is part of a wafer comprising a plurality of mother dies. For example, the mother dies of the wafer are stacked with dies to form a plurality of die stacks.

Figures 3I, 3J:
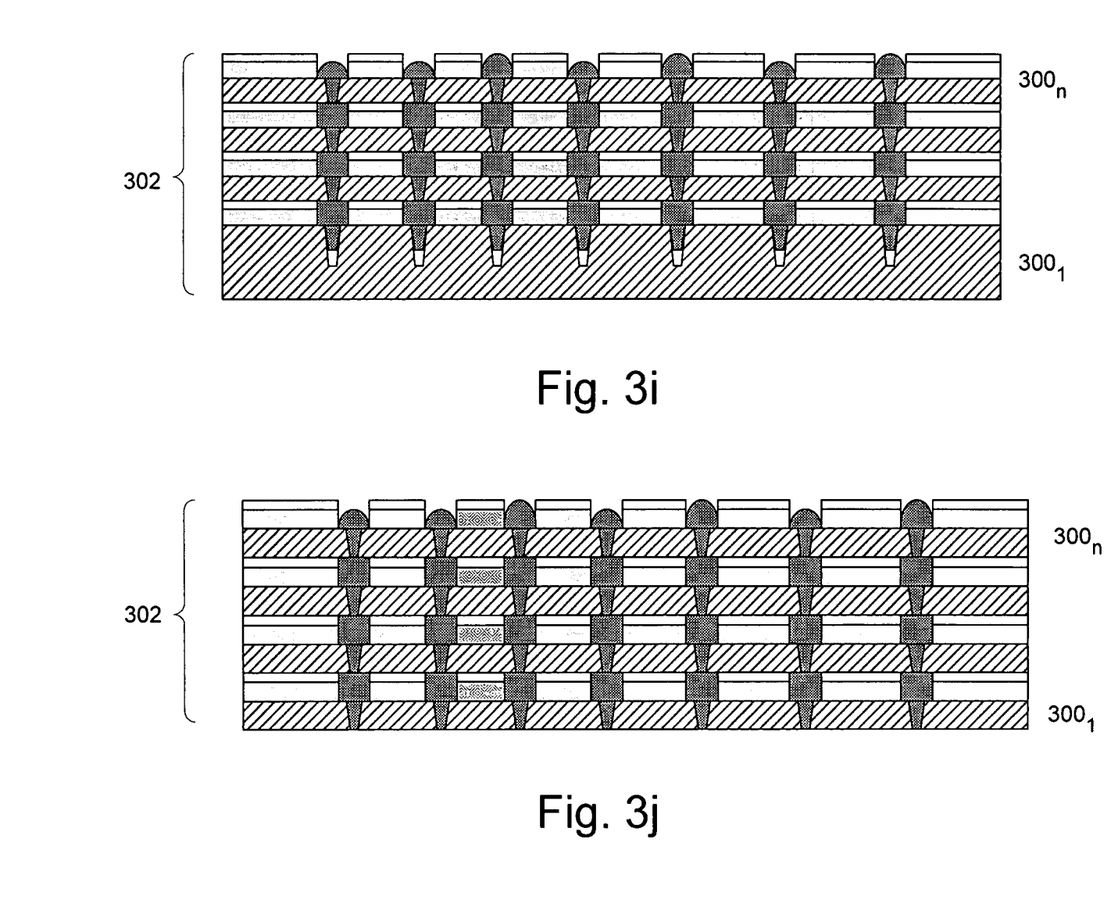

In FIG. 3i, the die stack is reflowed, resulting in the melting of the surface and via contacts of each die and filling of the spaces in the contact openings of the dies below the top die. The reflow forms connections between the dies of the die stack. It will be understood that the reflow temperature would be dependent on the type of material used to form the surface and via contacts and would typically be the temperature at which the material would melt and form the inter-die connections. After reflow, backgrinding is performed on the wafer with the mother dies to expose the bottom of the vias, as shown in FIG. 3j. After backgrinding, the wafer is diced to separate it into a plurality of individual die stacks. Alternatively, the dies are stacked on an individual ungrinded mother die which is subsequently thinned to expose the bottom of the vias.

Other embodiments of forming the die stack are also useful. For example, dies of the die stack can remain as part of a wafer. A plurality of wafers are stacked onto the wafer with the mother dies. This produces a wafer stack comprising plurality of die stacks. The process continues as described in FIG. 3i.

In another embodiment, the mother dies can be individual mother dies which are the same as the other dies of the die stack. Alternatively, backgrinding of the wafer with the mother dies is performed prior to stacking wafers with dies of the stack to form a wafer stack. That is, prior to stacking, the mother die has been thinned. This can be advantageous as the reflow step for the die stack can be integrated into a subsequent reflow process. For thinned mother dies, a temporary carrier substrate can be used as a support during the stacking process and removed thereafter.

Figure 3K:
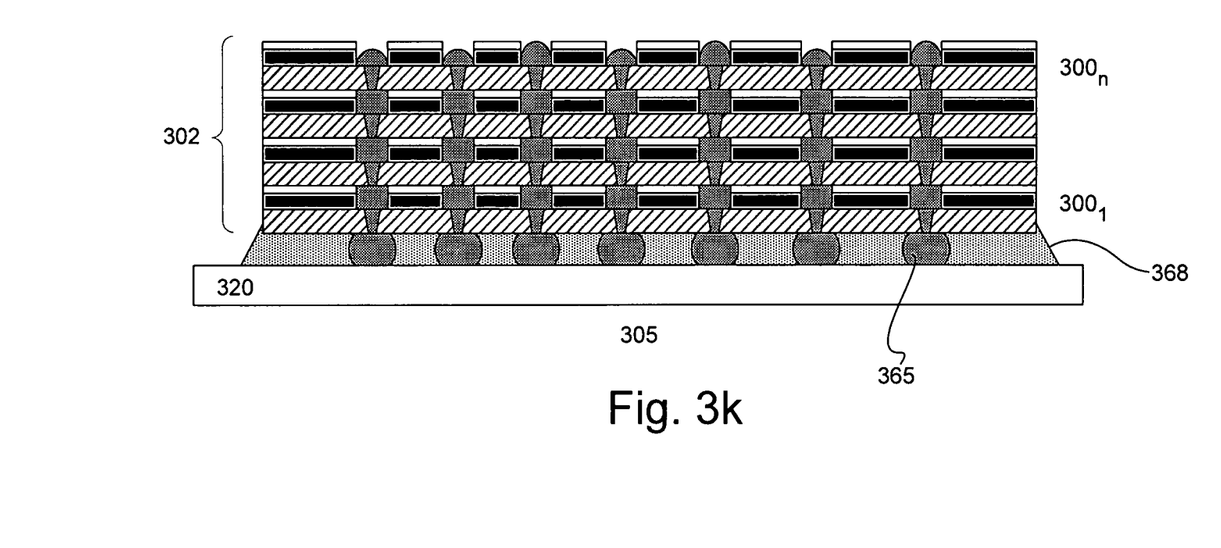

Referring to FIG. 3k, the die stack is assembled onto a carrier 320 of the chip package 305. In one embodiment, the stack is mounted onto bonding contacts 365 disposed on the bonding region of the carrier. The bonding region, for example, is located on the top surface of the carrier. The bonding contacts are mated to vias on the mother die. The bonding contacts are coupled to package contacts (not shown) located on, for example, the bottom surface of the carrier. A reflow is performed to form a permanent connection with the bonding contacts and vias. It will be understood that the reflow temperature depends on the material of the bonding contacts and would generally be at a temperature that is sufficient to melt and form an interconnection with the package contacts. An underfill material 368 can be provided to fill the space between the die stack and carrier.

As described, the present invention proposes using solder paste to fill the through silicon vias. Solder plating and reflow for forming solder bumps and via hole filling are relatively faster and cheaper compared to current TSV process with Cu filling. Additionally, under bump metallization (UBM) and bumping are not required on the second surface of the wafer as solder is used to create connection during reflow process. Due to liquid characteristic of solder in the reflow temperature, void or air bubble can be easily removed through via hole channel. Moreover, for applications in which the mother die or wafer remains un-grinded until after the stacking of the dies or wafers is completed, there is no need for a temporary support carrier to support the stacked assembly during stacking and hence special bonding and debonding requirements are not necessary.

The invention may be embodied in other specific forms without departing from the spirit or essential characteristics thereof. The foregoing embodiments, therefore, are to be considered in all respects illustrative rather than limiting the invention described herein.

What is claimed is:

1. A method of packaging comprising:
   providing n number of dies of a die stack, wherein a die of the die stack includes
      first and second major surfaces,
      a mask layer with a mask opening on the first major surface, and
      a through via contact having a via portion which extends from the first to the second major surface and an upper portion disposed in the mask opening, wherein the through via contact is formed by reflowing a first conductive material disposed in the mask opening to cause it to flow into a via in communication with the mask opening to form the via portion of the through via contact while the upper portion partially fills the mask opening and contacts inner walls of the mask opening while leaving a space therein;
   stacking the n number of dies to form the die stack, wherein a bottom die of the die stack is the first die and a top die of the die stack is the $n^{th}$ die, the n number of dies of the die stack are stacked such that the mask of a die below ($i^{th}-1$ die) contacts the second surface of a die above ($i^{th}$ die), wherein the through via contact of the die above is aligned with the partially filled mask opening of the die below; and
   reflowing the first conductive material of the through via contacts of the die stack, wherein the space of the partially filled mask opening of the $i^{th}-1$ die is completely filled by the reflowed conductive material of the through via contact of the $i^{th}$ die to form connections between the dies of the die stack.

2. The method of claim 1 wherein the first conductive material comprises solder.

3. The method of claim 1 comprising filling the mask opening with the first conductive material, wherein filling the mask opening comprises printing with solder paste using a stencil.

4. The method of claim 3 comprises removing the stencil after filling the mask opening.

5. The method of claim 1 wherein the mask layer includes a die attach film for attaching another die on the first surface of the die.

6. The method of claim 1 wherein bottom of the through via contact is coplanar with the second major surface of the die.

7. The method of claim 1 wherein:
   the through via contact is formed by forming a via having a blind via in the die; and
   backgrinding the second major surface of the die to expose the bottom of the via contact such that the bottom of the through via contact is coplanar with the second major surface of the die.

8. The method of claim 7 wherein the via comprises tapered sidewalls.

9. The method of claim 1 wherein:
upper dies of the stack comprises second major surfaces with exposed bottom via contacts; and
a bottom die of the stack (n=1) comprises an ungrinded second major surface with an unexposed via contact.

10. The method of claim 9 comprises backgrinding the second surface of the bottom die (n=1) to expose bottom of the via contact.

11. The method of claim 1 wherein n comprises more than two dies.

12. A method of packaging comprising:
providing n number of dies, wherein a die of the n number of dies comprises
first and second major surfaces with a mask prepared on the first major surface with mask openings, and
through via contacts, wherein each of the through via contacts has a via portion which extends from the first to the second major surface and an upper portion disposed in the mask opening, wherein the through via contact is formed by reflowing a single conductive material disposed in the mask opening to cause it to flow into a via in communication with the mask opening to form the via portion of the through via contact while the upper portion partially fills the mask opening and contacts inner walls of the mask opening while leaving spaces therein;
stacking the n number of dies to form a die stack, wherein a bottom die of the die stack is the first die and a top die of the die stack is the $n^{th}$ die, the n number of dies of the die stack are stacked such that the mask of a die below ($i^{th}-1$ die) contacts the second surface of a die above ($i^{th}$ die), wherein the through via contacts of the die above are aligned with the partially filled mask openings of the die below; and
reflowing the single conductive material of the through via contacts of the die stack, wherein the spaces of the partially filled mask openings of the $i^{th}-1$ die is completely filled by the reflowed single conductive material of the through via contacts of the $i^{th}$ die to form electrical connections between the dies of the die stack.

13. The method of claim 12 wherein the mask includes a die attach film.

14. The method of claim 12 wherein the bottom die of the die stack (n=1) comprises an ungrinded second major surface with unexposed via contacts and further comprises backgrinding the second surface of the bottom die to expose bottoms of the via contacts after forming the die stack.

15. The method of claim 12 wherein the through via contacts comprise tapered sidewalls.

* * * * *